United States Patent [19]
Ohe

[11] Patent Number: 5,081,059

[45] Date of Patent: Jan. 14, 1992

[54] METHOD OF FORMING SEMICONDUCTOR INTEGRATED CIRCUIT USING MASTER SLICE APPROACH

[75] Inventor: Ryoichi Ohe, Isehara, Japan

[73] Assignee: Fujitsu Limited, Kawasaki, Japan

[21] Appl. No.: 366,486

[22] Filed: Jun. 15, 1989

[30] Foreign Application Priority Data

Jun. 16, 1988 [JP] Japan .................. 63-146865

[51] Int. Cl.$^5$ ............................ H01L 21/70
[52] U.S. Cl. ........................ 437/48; 437/40; 437/41; 437/51; 437/56; 437/57; 437/195
[58] Field of Search .............. 437/48, 51, 56, 57, 437/195; 357/40, 41; 364/491

[56] References Cited

U.S. PATENT DOCUMENTS

| | | | |
|---|---|---|---|
| 4,644,382 | 2/1987 | Charransol et al. | 357/40 |
| 4,688,070 | 8/1987 | Shiotari et al. | 357/40 |
| 4,750,027 | 6/1988 | Asami | 357/40 |
| 4,783,692 | 11/1988 | Uratani | 357/40 |

FOREIGN PATENT DOCUMENTS 60-144956 7/1985 Japan .

Primary Examiner—Brian E. Hearn
Assistant Examiner—Tom Thomas
Attorney, Agent, or Firm—Staas & Halsey

[57] ABSTRACT

A method of forming a semiconductor integrated circuit using a master slice approach includes the steps of: forming a plurality of transistor regions with units of a predetermined number in array on a semiconductor chip; forming a plurality of first wirings extending in parallel at a space therebetween with units of a predetermined length in a discontinuous form so that the first wirings pass through regions corresponding to the transistor regions; forming first contact holes at predetermined positions so that gate regions and source/drain regions of the transistor regions are connected to the first wirings; forming a plurality of second wirings having same forms as the plurality of first wirings so that the second wirings constitute a mesh-like arrangement in combination with the first wirings; and forming second contact holes using a pattern mask programmable in accordance with demanded conditions of a given circuit so that the second contact holes connect the second wirings to the first wirings. By changing only the form of the disposition of the second contact holes, it is possible to simplify an entire process to greatly reduce a turnaround time and make an improvement in yield.

7 Claims, 16 Drawing Sheets

TR···TRANSISTOR REGION
S/D···S/D REGION
G···GATE REGION
F···FIELD REGION

[ - - - ] ··· TRANSISTOR REGION

──── ··· FIRST Al WIRING (LA)

[ ‾ ‾ ] ··· TRANSISTOR REGION

——— ··· FIRST Al WIRING(LA)

× ··· FIRST CONTACT HOLE(NA)

[- - -] ··· TRANSISTOR REGION

——— ··· FIRST Al WIRING(LA)

× ··· FIRST CONTACT HOLE(NA)

═══ ··· SECOND Al WIRING(LB)

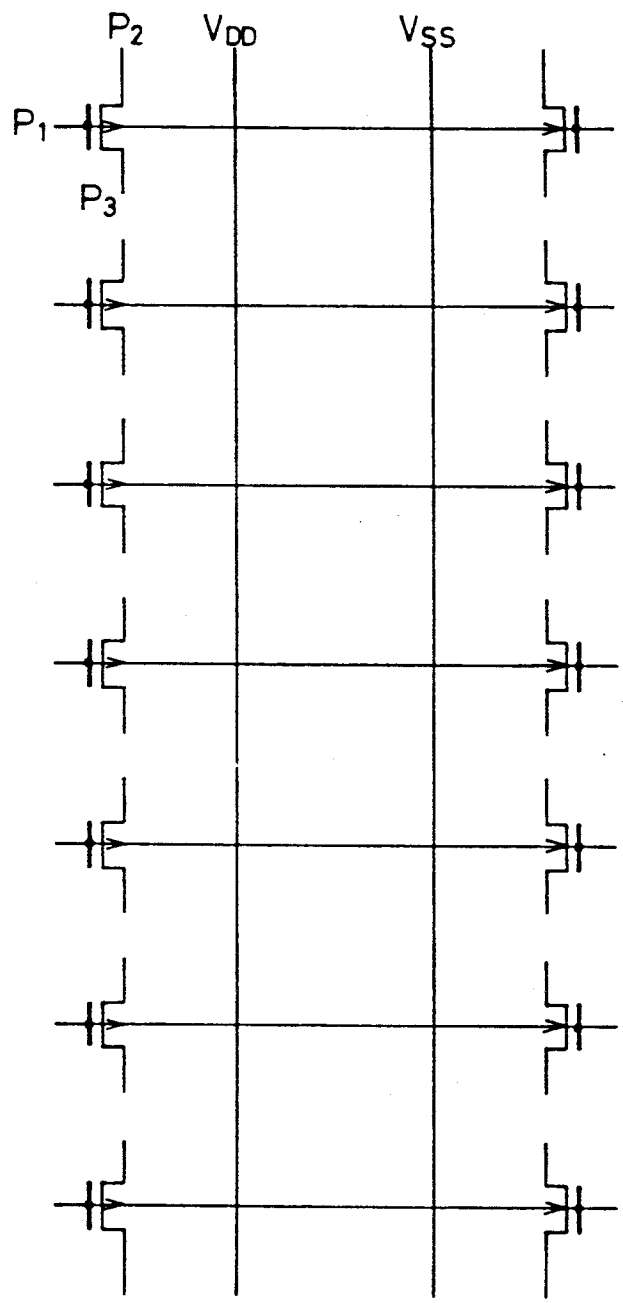

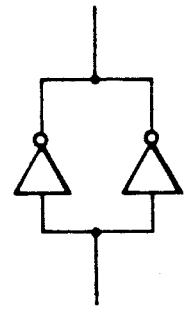
Fig.4C
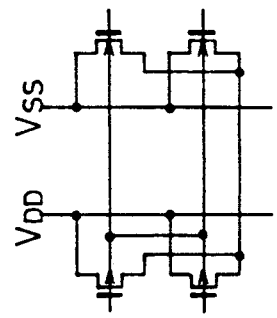
Fig.5C
Fig.4B
Fig.5B
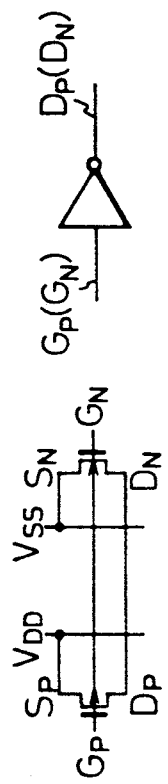
Fig.4A
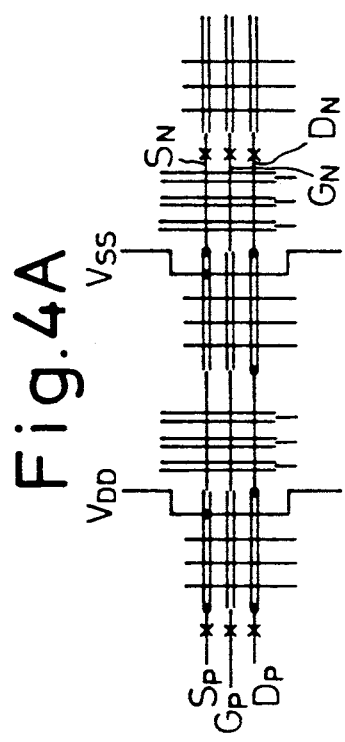
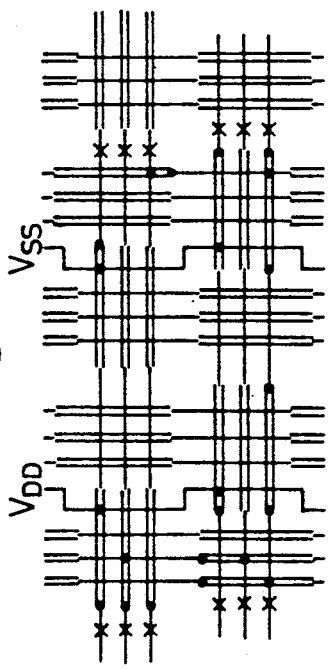
Fig.5A
× ... FIRST CONTACT HOLE (NA)
• ... SECOND CONTACT HOLE (NB)

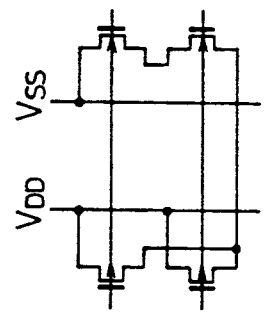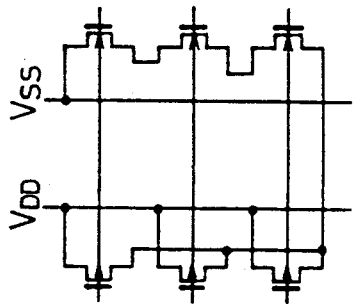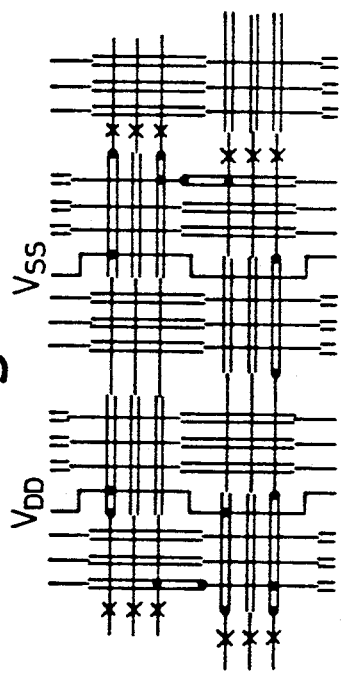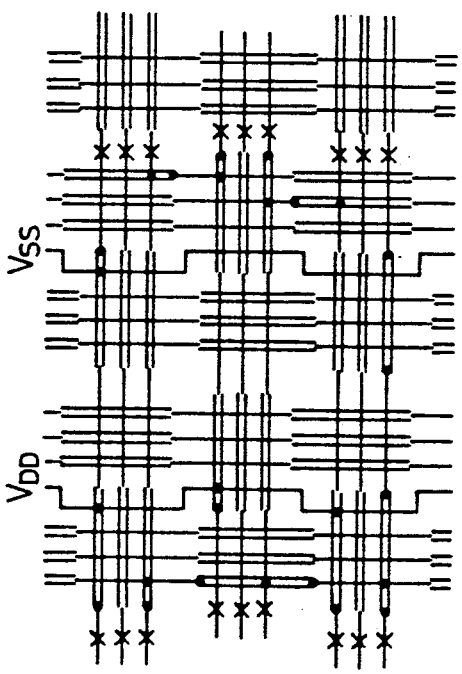

5,081,059

METHOD OF FORMING SEMICONDUCTOR INTEGRATED CIRCUIT USING MASTER SLICE APPROACH

BACKGROUND OF THE INVENTION

1. Field of the Invention

The present invention relates to a technique of utilizing a master slice approach and, more particularly, to a method of forming a semiconductor integrated circuit or large scale integration (LSI) circuit by forming each circuit pattern by units of a functional block on a semiconductor chip, using the master slice approach.

2. Description of the Related Art

The master slice approach is one of the fixed wiring approaches based on "LSI on slice" approach. In the master slice approach, a common pattern formed by means of a diffusion process (a transistor pattern, called a basic cell, in the form of a constant, i.e., fixed, arrangement) is prepared, and then, a wiring pattern is applied to the common pattern configured in accordance with the forms of the LSI or the specification or conditions demanded by a user. Therefore, a desired LSI can be constituted by designing and forming the wiring pattern in various ways. In constituting the desired LSI, two kinds of aluminium (Al) wiring pattern masks and two kinds of contact hole pattern masks are generally employed. Note, a first contact hole (hereinafter indicated by reference NA) effects a connection between a conduction region of a functional element, such as a transistor formed on the substrate, and a first Al wiring pattern (hereinafter indicated by reference LA), and a second contact hole (hereinafter indicated by reference NB) effects a connection between the first Al wiring pattern LA and a second Al wiring pattern (hereinafter indicated by reference LB).

Namely, a known typical master slice approach comprises the steps of forming fixed transistor patterns and forming a programmable wiring pattern. The latter step requires four processes of forming first contact holes NA in a first insulation layer formed on the substrate, forming thereon a first wiring pattern LA, forming second contact holes NB in a second insulation layer formed thereon, and forming thereon a second wiring pattern LB. In this case, each pattern employed in each of the four processes must be changed in accordance with user's demands or the forms of the LSI. This leads to a complication of the process and a prolongation of the designing period, and thus is not preferable. Accordingly, it would be preferable to decrease the number of the processes requiring a change or programming based on the user's demands, from a viewpoint of the reduction of the turnaround time and the simplification of the entire process.

SUMMARY OF THE INVENTION

An object of the present invention is to provide a method of forming a semiconductor integrated circuit which can simplify the overall process and greatly reduce the turnaround time, while making an improvement in yield.

According to the present invention, there is provided a method of forming a semiconductor integrated circuit using a master slice approach including the steps of: forming a plurality of transistor regions arranged as an array of a predetermined number of units on a semiconductor chip and then forming a first insulation layer over all the transistor regions; forming a first pattern of a plurality of first wirings extending in parallel and spaced relationship and arranged as units, each of a predetermined length and in a discontinuous form as to successive such units and so that the first wirings pass through regions corresponding to the transistor regions; forming first contact holes at predetermined positions in the first insulation layer so that gate regions and source/drain regions of the transistor regions are connected to the first wirings and then forming a second insulation layer over all the first wiring pattern and the first contact holes; forming a second pattern of a plurality of second wirings having the same forms as the plurality of first wirings so that the second wirings constitute a mesh-like arrangement in combination with the first wirings; and forming second contact holes in the second insulation layer using a pattern mask programmable in accordance with demanded conditions of a given circuit so that the second contact holes selectively connect the second wirings to the first wirings.

BRIEF DESCRIPTION OF THE DRAWINGS

Other objects and features of the present invention will be described hereinafter in detail by way of preferred embodiments with reference to the accompanying drawings in which:

FIG. 3 is an equivalent circuit diagram of the pattern shown in FIG. 2C;

FIGS. 4A to 4C are diagrams illustrating a first example of the pattern by units of a functional block produced using the pattern shown in FIG. 2D;

FIGS. 5A to 5C are diagrams illustrating a second example of the pattern by units of a functional block produced using the pattern shown in FIG. 2D;

FIGS. 6A to 6C are diagrams illustrating a third example of the pattern by units of a functional block produced using the pattern shown in FIG. 2D;

FIGS. 7A to 7C are diagrams illustrating a fourth example of the pattern by units of a functional block produced using the pattern shown in FIG. 2D;

DESCRIPTION OF THE PREFERRED EMBODIMENTS

Before explaining the preferred embodiment of the present invention, the constitution of the transistor cell or pattern will be explained with reference to FIGS. 1A to 1D, which illustrate a typical example thereof.

Figure 1A:
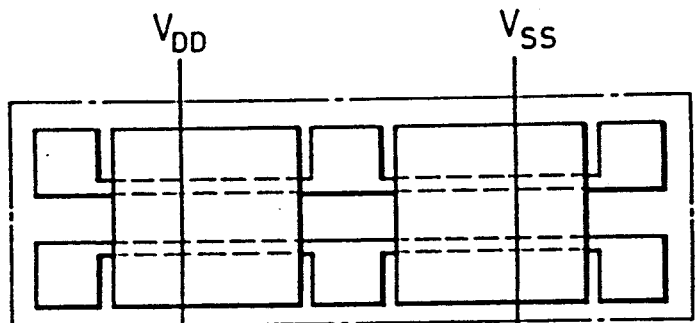
FIGS. 1A, 1B, 1C and 1D are pattern diagrams illustrating a typical example of a transistor pattern of a basic cell.
Figure 1B:
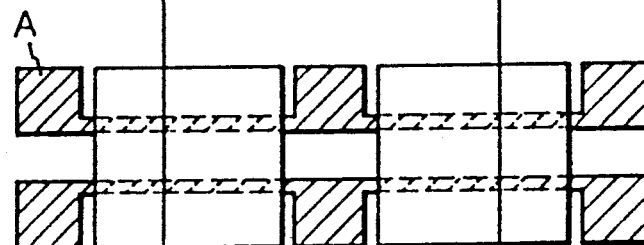
Figure 1C:
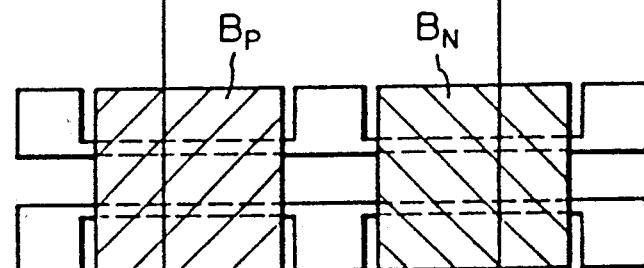
Figure 1D:
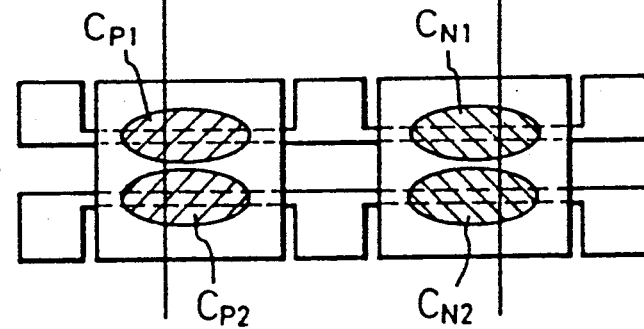

In each of FIGS. 1A to 1D, reference $V_{DD}$ denotes a pattern of a higher voltage power supply line and reference $V_{SS}$ denotes a pattern of a lower voltage power supply line. FIG. 1A shows a transistor pattern corresponding to one basic cell (shown by a dot and dash line). In FIG. 1B, a hatched portion A represents a gate region of the transistor. Also, hatched portions $B_P$ and $B_N$ in FIG. 1C represent a P-type impurity region and an N-type impurity region, respectively, constituting source/drain (S/D) regions of the transistor. FIG. 1D shows a region on which the transistors are formed. Namely, hatched portions $C_{P1}$ and $C_{P2}$ represent P-channel transistors and hatched portions $C_{N1}$ and $C_{N2}$ represent N-channel transistors. Thus, in the example of FIG. 1, one basic cell is constituted by a pair of P-channel transistors and a pair of N-channel transistors.

Next, a preferred embodiment according to the present invention will be explained with reference to FIGS. 2A to 2D, which show the process of forming the common pattern based on which various patterns, arranged as functional blocks, or units, are constituted.

Figure 2A:
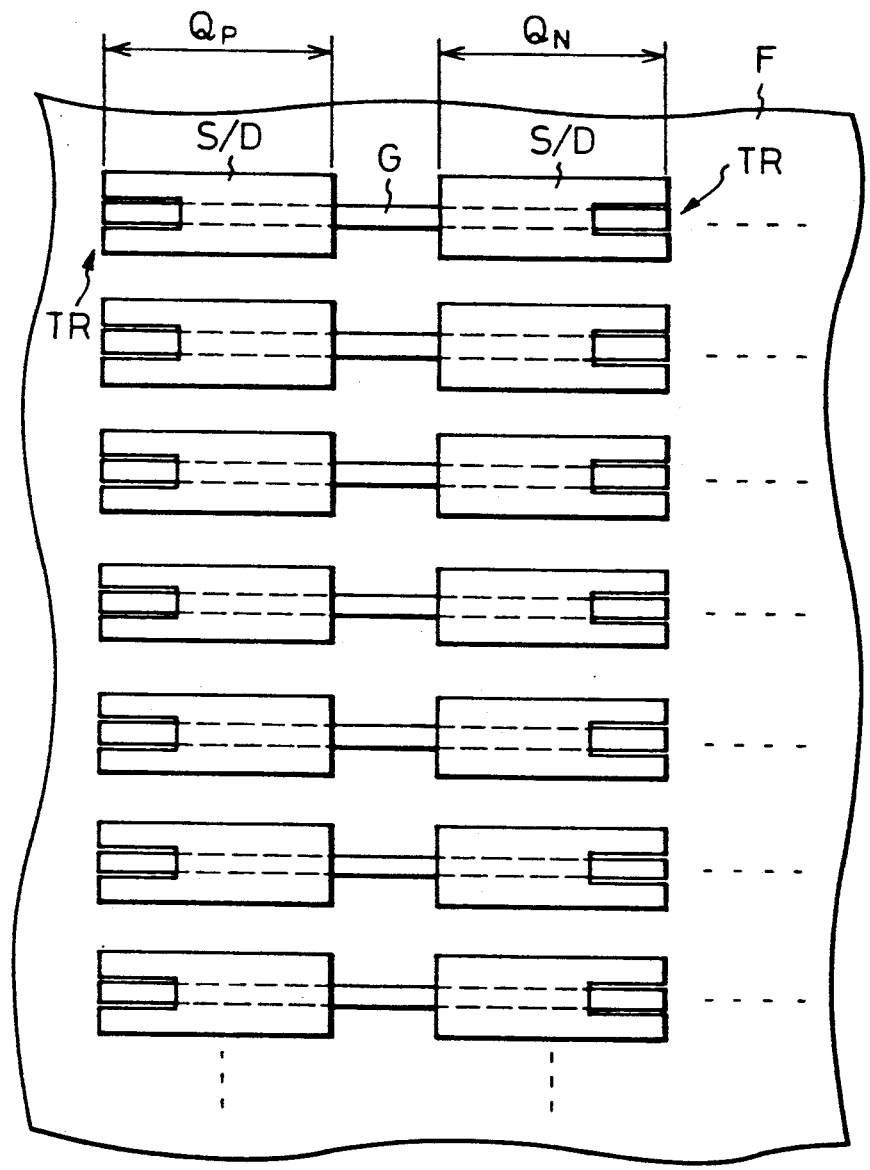
FIGS. 2A to 2D are diagrams for explaining the process according to one embodiment of the present invention.

FIG. 2A illustrates an example of the transistor pattern formed by means of the diffusion process (first process). In the illustration, reference TR denotes a transistor region; reference G a gate region; reference S/D a source/drain (S/D) region; and reference F a field region, respectively. Two transistors connected by the common gate region, i.e., P-channel transistor $Q_P$ and N-channel transistor $Q_N$, constitute one basic cell.

Namely, in the first process, the transistor regions (patterns) TR are arranged as an array of units, each unit including the basic cell, on a semiconductor chip. After this, a first insulation layer (not shown) is formed over all of at least the transistor regions of the units.

Figure 2B:
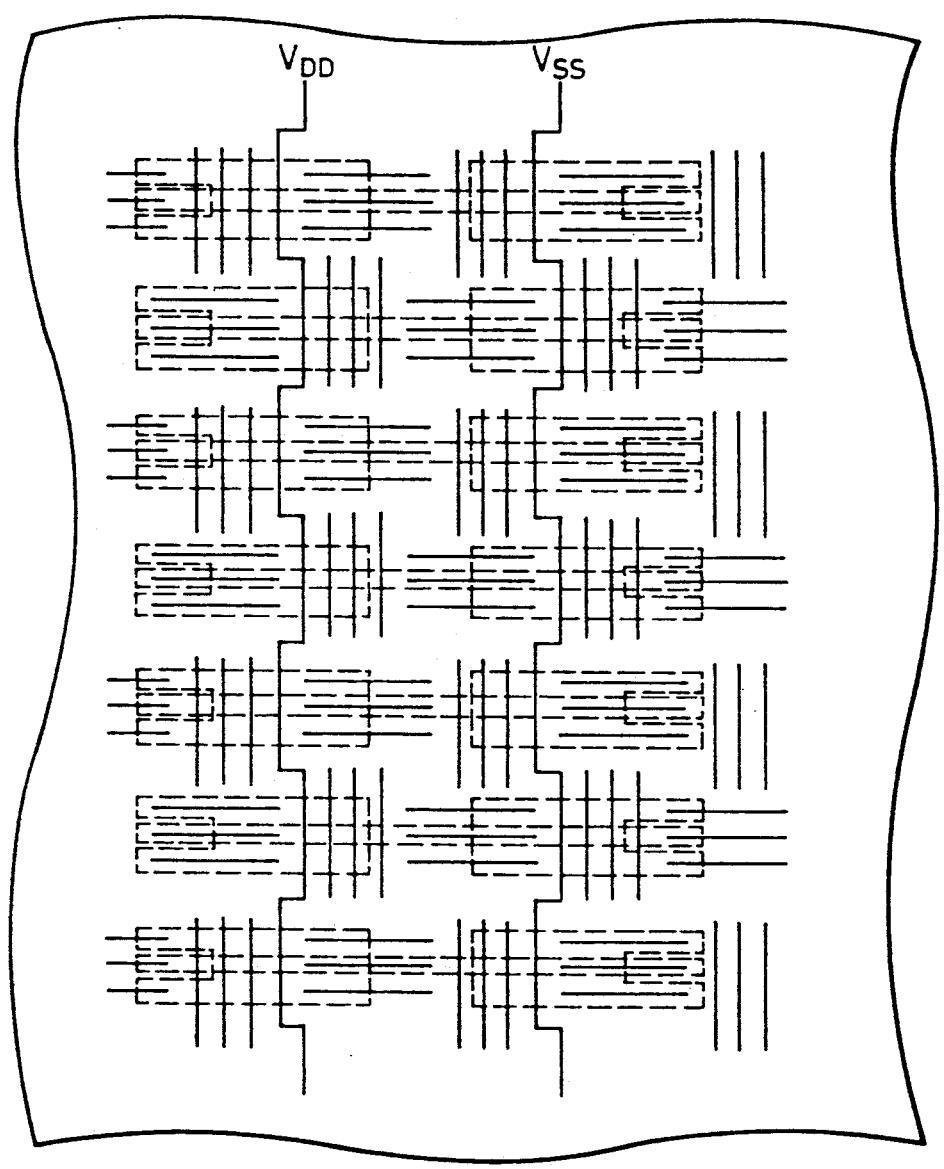

FIG. 2B illustrates an example of the first Al wiring pattern LA formed by means of a second process and applied to the pattern of FIG. 2A. In the illustration, the portion shown by a broken line represents the transistor region and the portion shown by a single line represents the first wiring pattern LA. More particularly, the pattern LA indicated by reference $V_{DD}$ represents the higher voltage power supply line (5V) and the pattern LA indicated by reference $V_{SS}$ represents the lower voltage power supply line (0V).

In the second process, there are also formed first wiring patterns LA which extend in parallel spaced relationship, arranged in units of three lines, or wires, per unit, the units being of a predetermined length and discontinuous, so that they pass through respective regions corresponding to the transistor regions. Also, the wiring patterns serving as the power supply lines $V_{DD}$ and $V_{SS}$ are formed so that they do not intersect the wires of the first wiring pattern LA and, further so as to pass through regions corresponding to the transistor regions along the longitudinal direction.

Figure 2C:
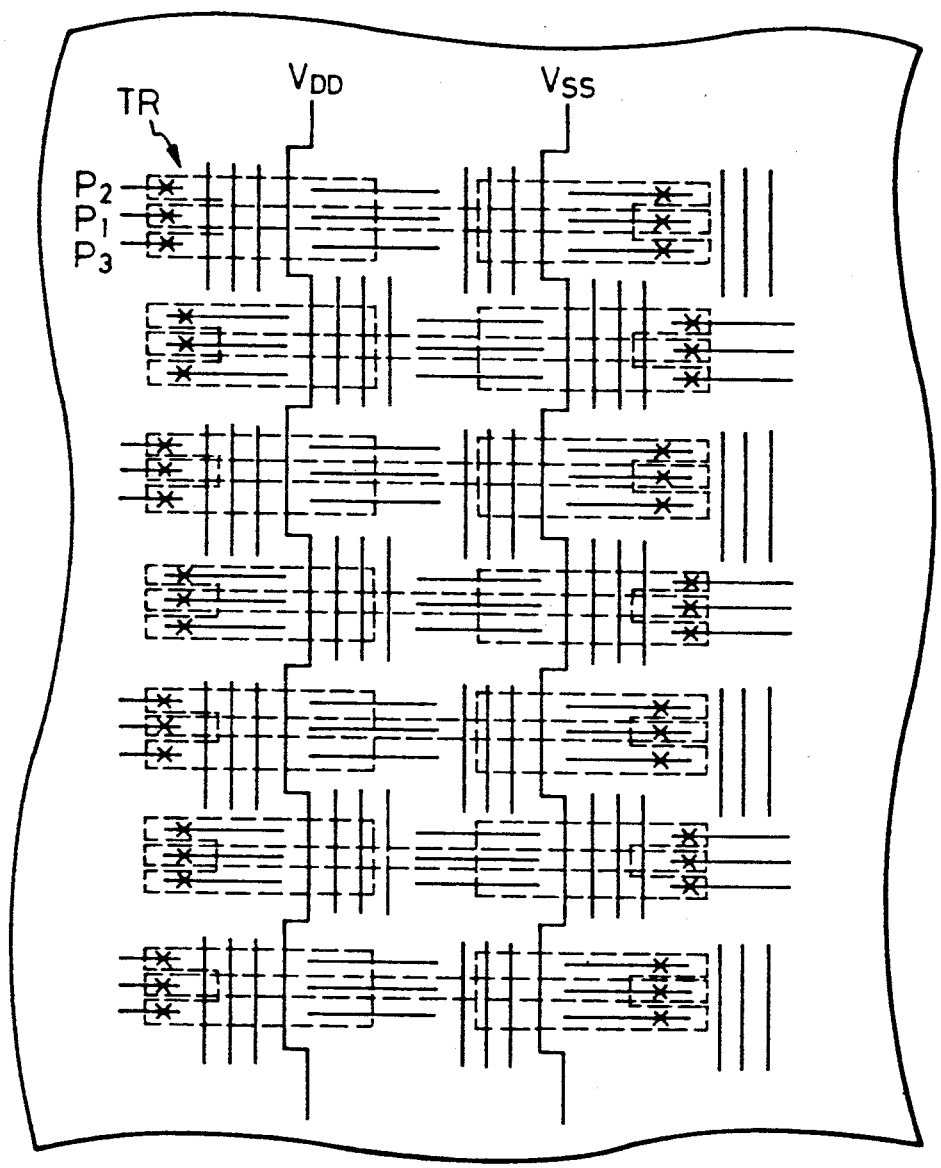

FIG. 2C illustrates an example of the first contact hole pattern NA formed by means of a third process and applied to the pattern of FIG. 2B. In the illustration, the portions shown by the broken lines represent the transistor regions; the portions shown by the single solid lines represent the first wiring pattern LA; and the portions shown by cross marks represent the first contact hole pattern NA.

In the third process, the first contact hole patterns NA are formed at predetermined positions in the first insulation layer so that gate regions G and source/drain regions S/D of the transistor regions TR are connected to the first wiring pattern LA. After this, a second insulation layer (not shown) is formed over all the first wirings and the first contact holes. Therefore, the pattern is formed in which three terminals of the transistor, i.e., the gate, source and drain, are fixedly connected via the first contact hole NA to corresponding wires of the first wiring pattern LA. The circuit constitution equivalently showing the pattern of FIG. 2C is shown in FIG. 3. In the illustration, reference $P_1$ corresponds to the gate and references $P_2$ and $P_3$ correspond to the source and drain, respectively.

Figure 2D:
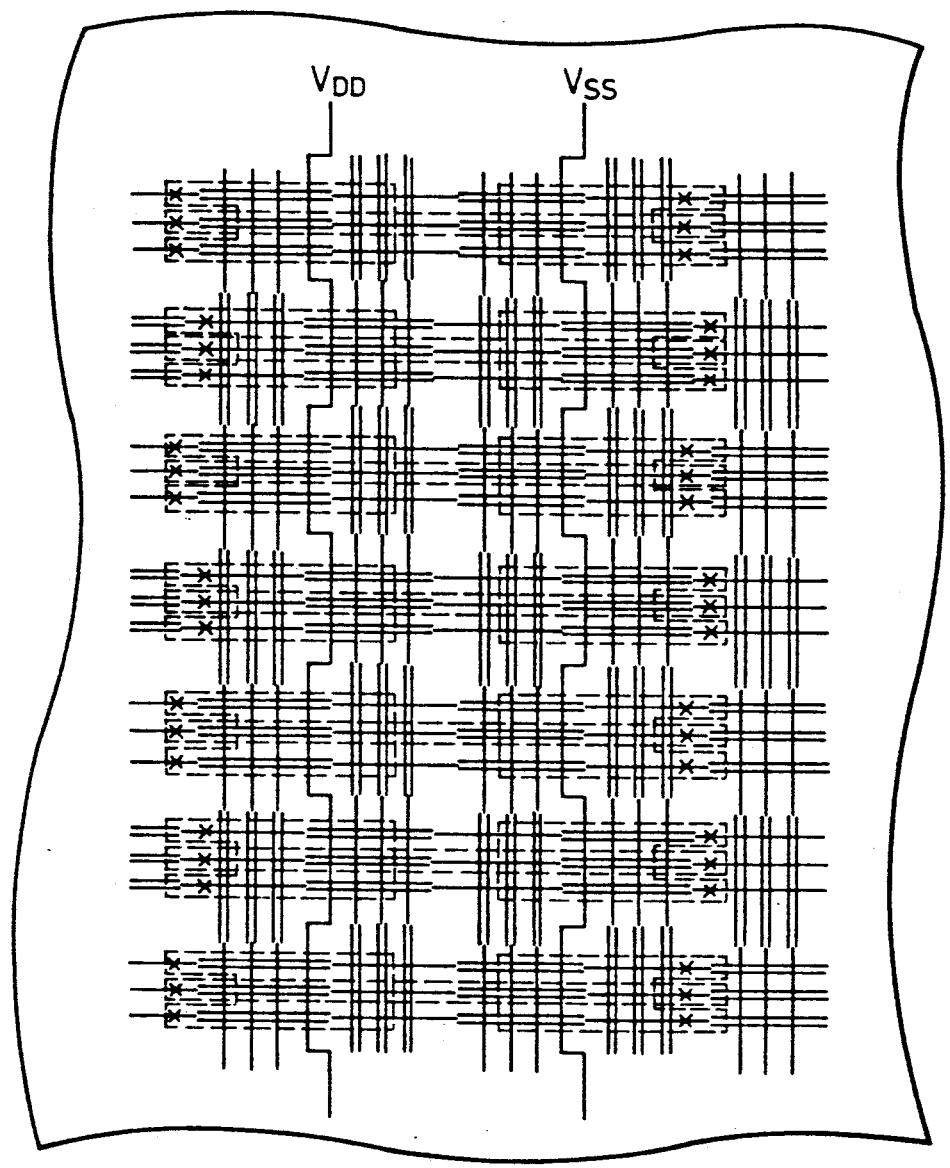

FIG. 2D illustrates an example of the second Al wiring pattern LB formed by means of a fourth process and applied to the pattern of FIG. 2C. In the illustration, the portions shown by the broken lines represent the transistor regions; the portion shown by the single solid lines represents the first wiring pattern LA; the portion shown by the cross marks represents the first contact hole pattern NA; and the portion shown by a pair of solid lines represents the second pattern of second wiring LB.

In the fourth process, the second wiring patterns LB having the same forms as the first wiring patterns LA are formed so that they constitute a mesh-like arrangement in combination with the first wirings.

Next, various patterns, formed as functional block units and produced using the common pattern shown in FIG. 2D, will be explained with reference to FIGS. 4A to 13C.

FIGS. 4A to 4C illustrate a constitution of an inverter circuit constituted by a single inverter. In FIG. 4A, the portion shown by a round black mark indicates the second contact hole pattern NB. Namely, the first wiring pattern and the second wiring pattern are connected at this portion (NB). FIG. 4B shows the pattern of FIG. 4A in the form of the equivalent circuit and FIG. 4C shows the circuit of FIG. 4B in the form of an inverter schematic indication. In each figure, the corresponding pattern or element is given the identical reference.

Figure 8A:
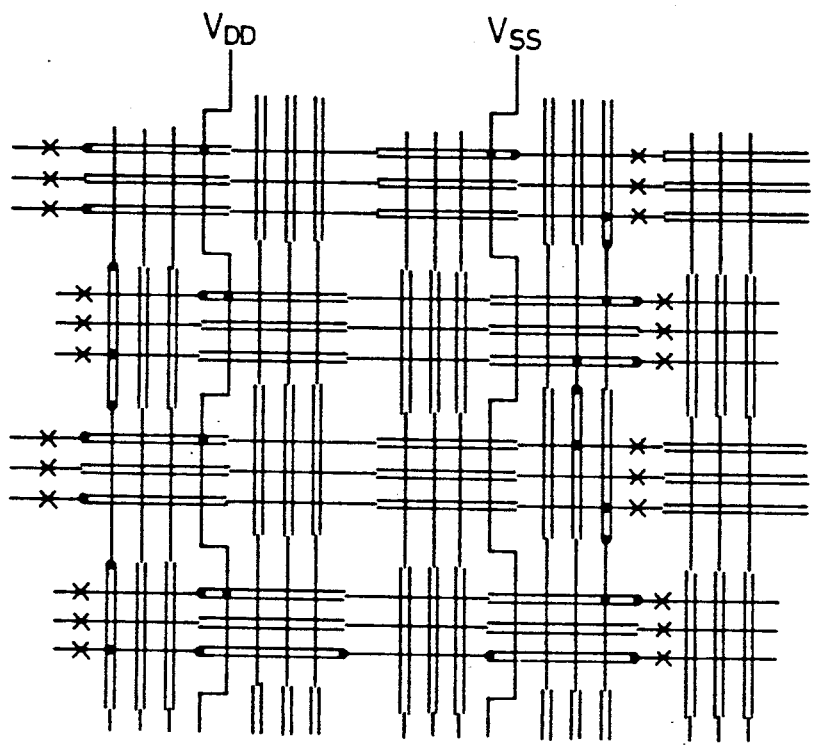
FIGS. 8A to 8C are diagrams illustrating a fifth example of the pattern by units of a functional block produced using the pattern shown in FIG. 2D.
Figure 8B:
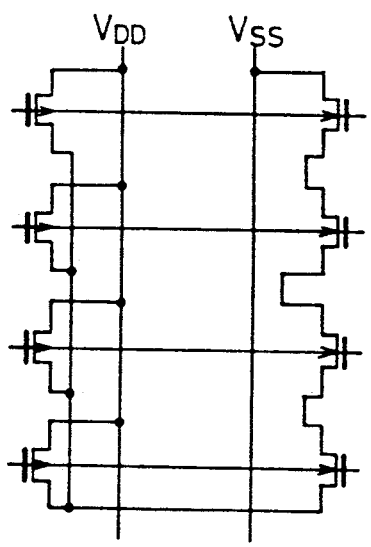
Figure 8C:
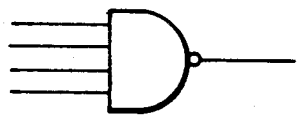
Figure 9A:
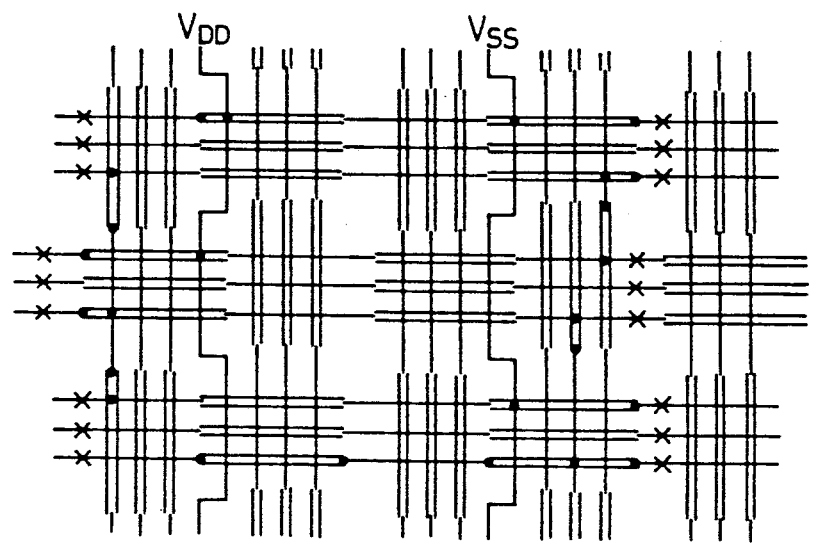
FIGS. 9A to 9C are diagrams illustrating a sixth example of the pattern by units of a functional block produced using the pattern shown in FIG. 2D.
Figure 9B:
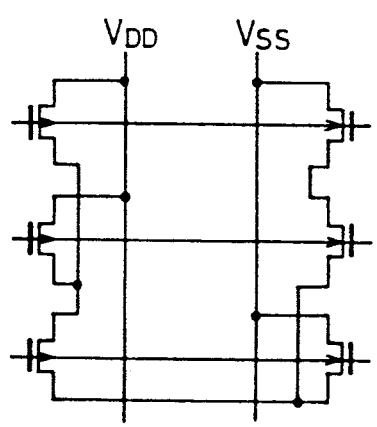
Figure 9C:
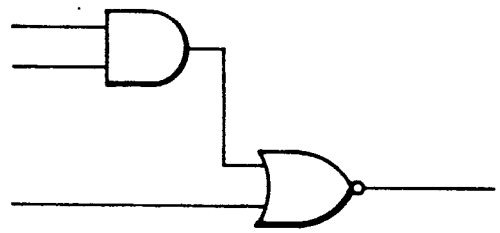
Figure 10A:
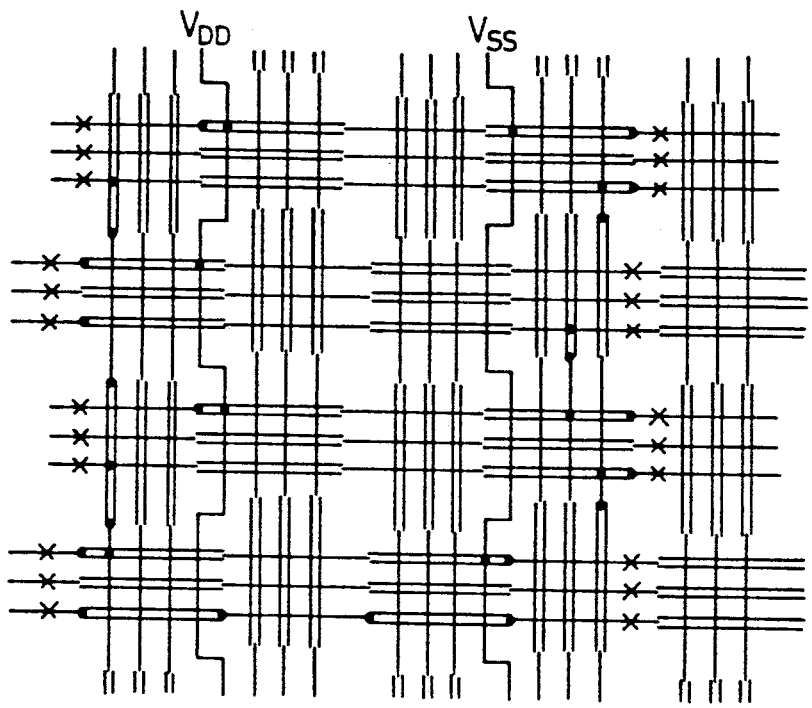
FIGS. 10A to 10C are diagrams illustrating a seventh example of the pattern by units of a functional block produced using the pattern shown in FIG. 2D.
Figure 10B:
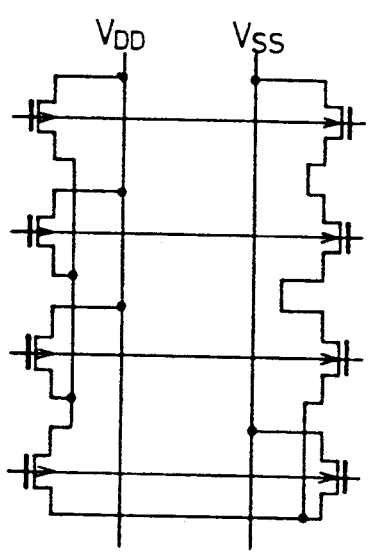
Figure 10C:
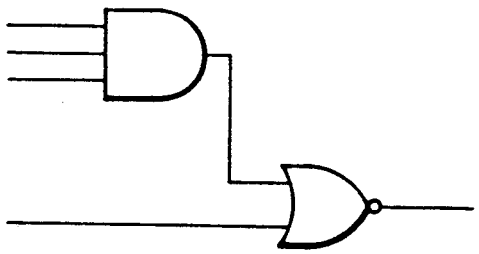
Figure 11A:
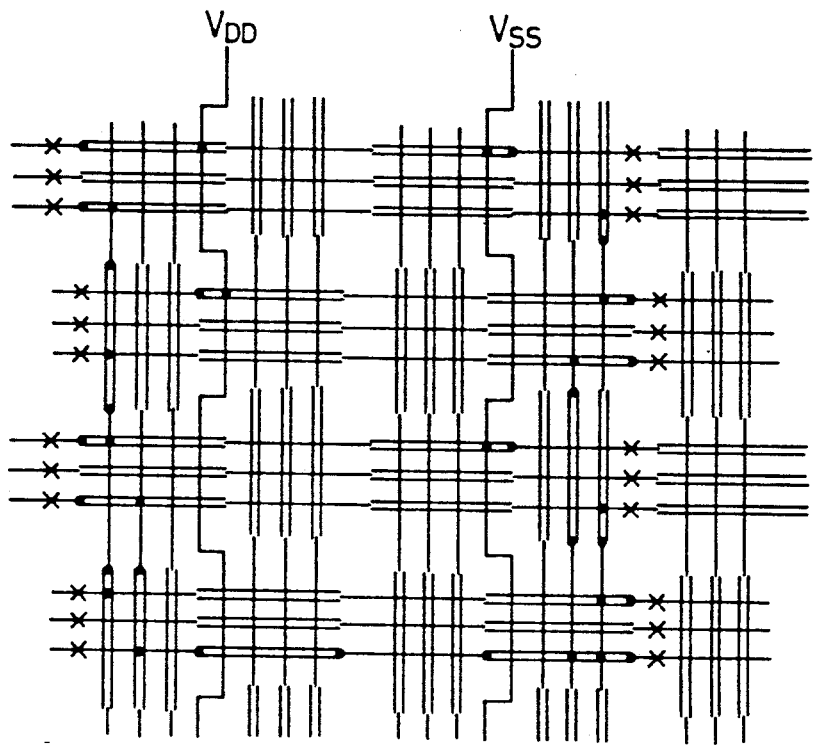
FIGS. 11A to 11C are diagrams illustrating an eighth example of the pattern by units of a functional block produced using the pattern shown in FIG. 2D.
Figure 11B:
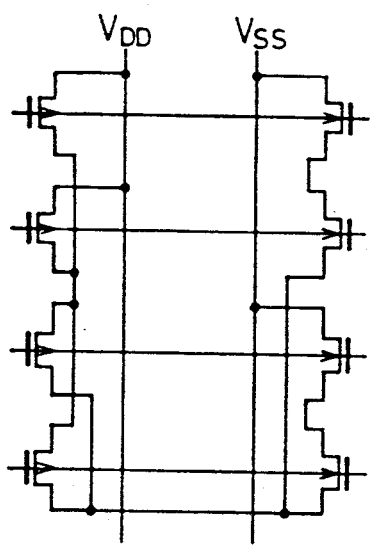
Figure 11C:
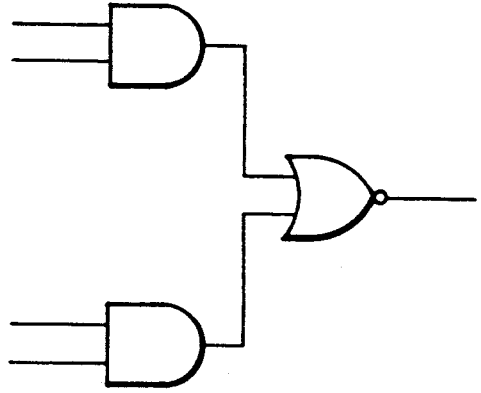
Figure 12A:
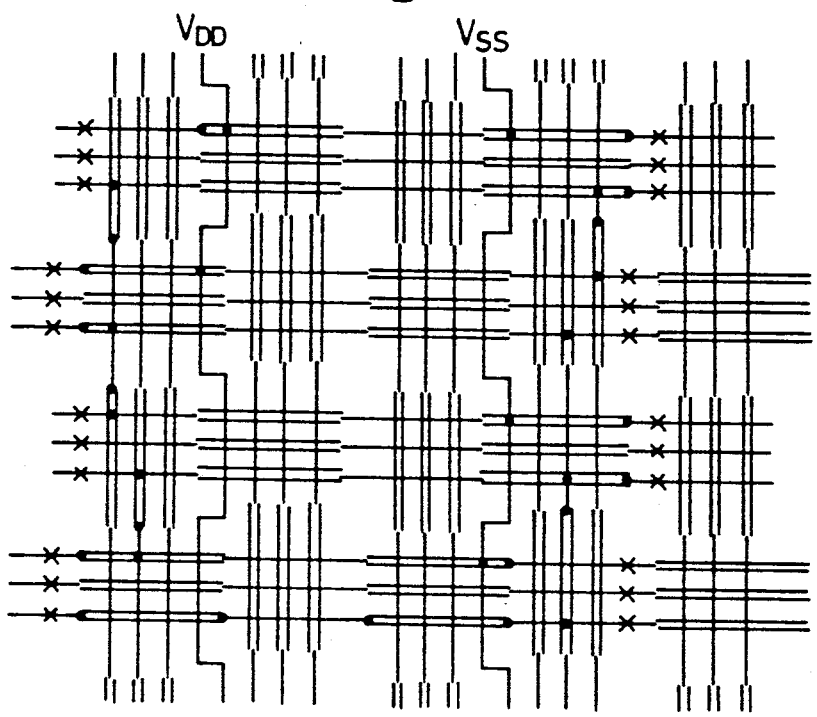
FIGS. 12A to 12C are diagrams illustrating a ninth example of the pattern by units of a functional block produced using the pattern shown in FIG. 2D.
Figure 12B:
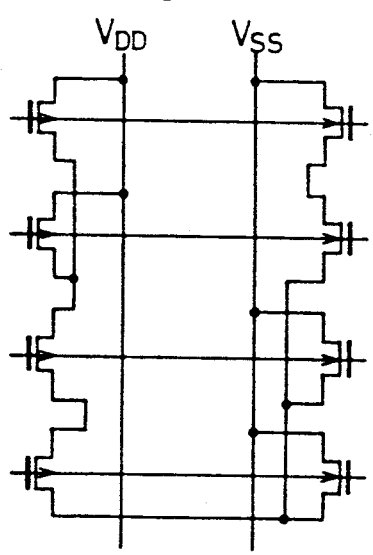
Figure 12C:
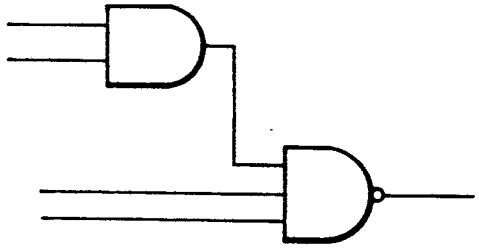
Figure 13A:
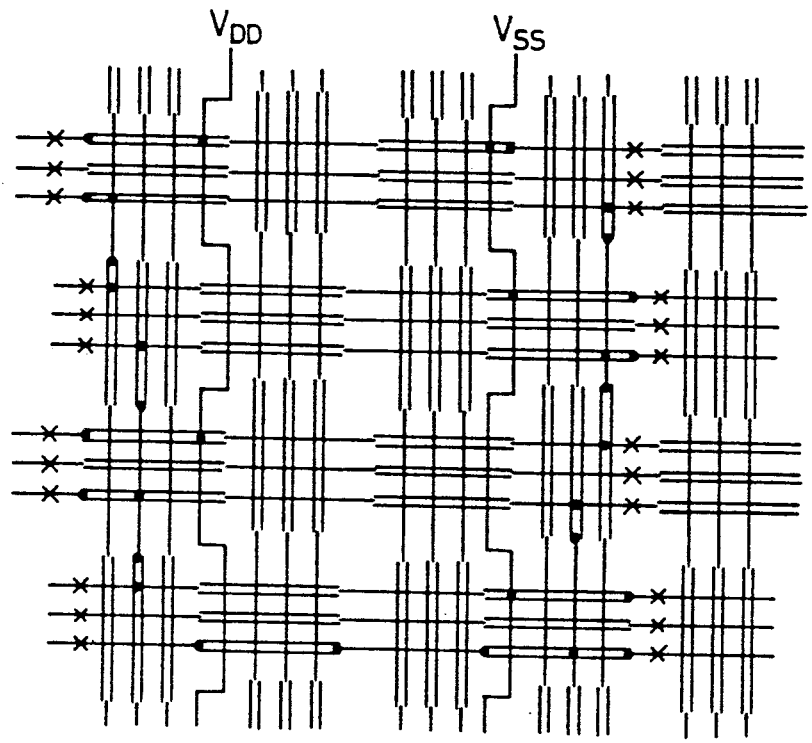
FIGS. 13A to 13C are diagrams illustrating a tenth example of the pattern by units of a functional block produced using the pattern shown in FIG. 2D.
Figure 13B:
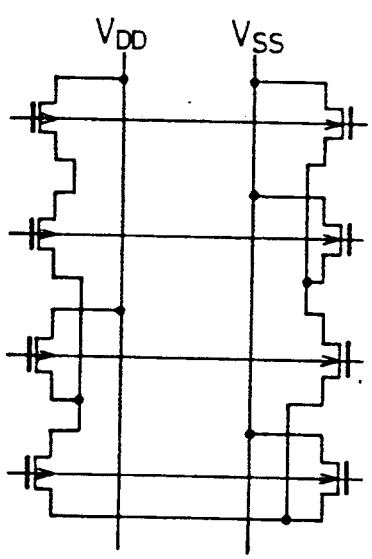
Figure 13C:
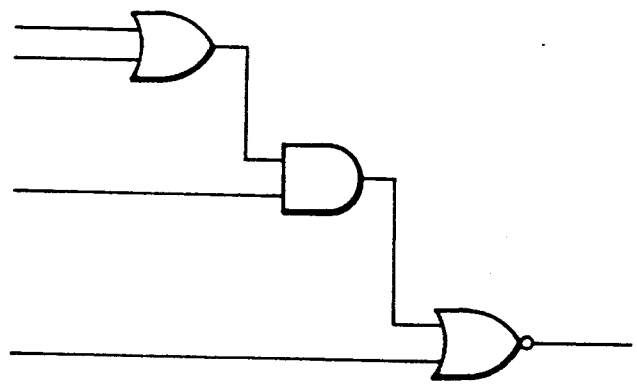

FIGS. 5A to 5C illustrate a constitution of an inverter circuit constituted by two inverters; FIGS. 6A to 6C illustrate a constitution of a two-input type NAND gate; FIGS. 7A to 7C illustrate a constitution of a three-input type NAND gate; FIGS. 8A to 8C illustrate a constitution of a four-input type NAND gate; FIGS. 9A to 9C illustrate a constitution of a three-input gate circuit constituted by a two-input type AND gate and a two-input type NOR gate; FIGS. 10A to 10C illustrate a constitution of a four-input gate circuit constituted by a three-input type AND gate and a two-input type NOR gate; FIGS. 11A to 11C illustrate a constitution of a four-input gate circuit constituted by a pair of two-input type AND gates and a two-input type NOR gate; FIGS. 12A to 12C illustrate a constitution of a four-input gate circuit constituted by a two-input type AND gate and a three-input type NAND gate; and FIGS. 13A to 13C illustrate a constitution of a four-input gate circuit constituted by a two-input type OR gate, a two-input type AND gate and a two-input type NOR gate.

As explained above, it is possible to constitute a desired LSI by suitably disposing the second contact hole patterns NB at selected intersections or abutments of the first wiring patterns LA and the second wiring patterns LB and changing the form of the disposition thereof in accordance with demanded conditions of a given circuit. Namely, since three kinds of patterns (i.e., of the first wiring LA, the first contact holes NA, and the second wirings LB) among the four kinds of patterns which heretofore had to be changed according to the user's demands, are fixedly prepared in the same manner as in the transistor pattern, the entire process can be simplified compared with the prior art process. This leads to a reduction of the turnaround time and thus contributes to an improvement of the yield.

Figure 14:
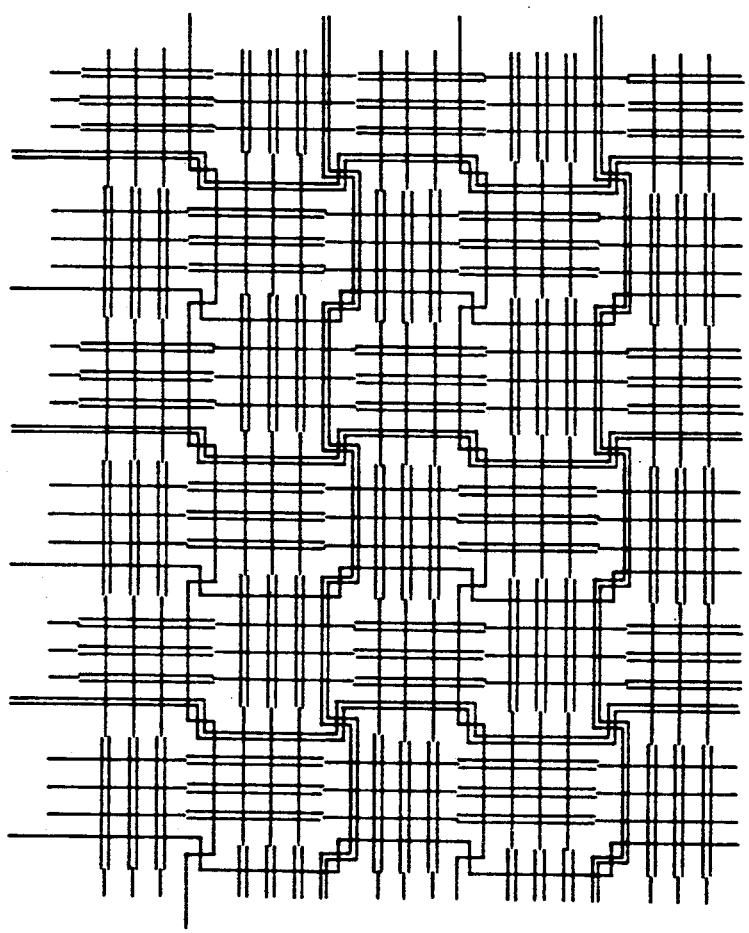
FIG. 14 is a pattern diagram illustrating a modification of the pattern shown in FIG. 2D.
Figure 15:
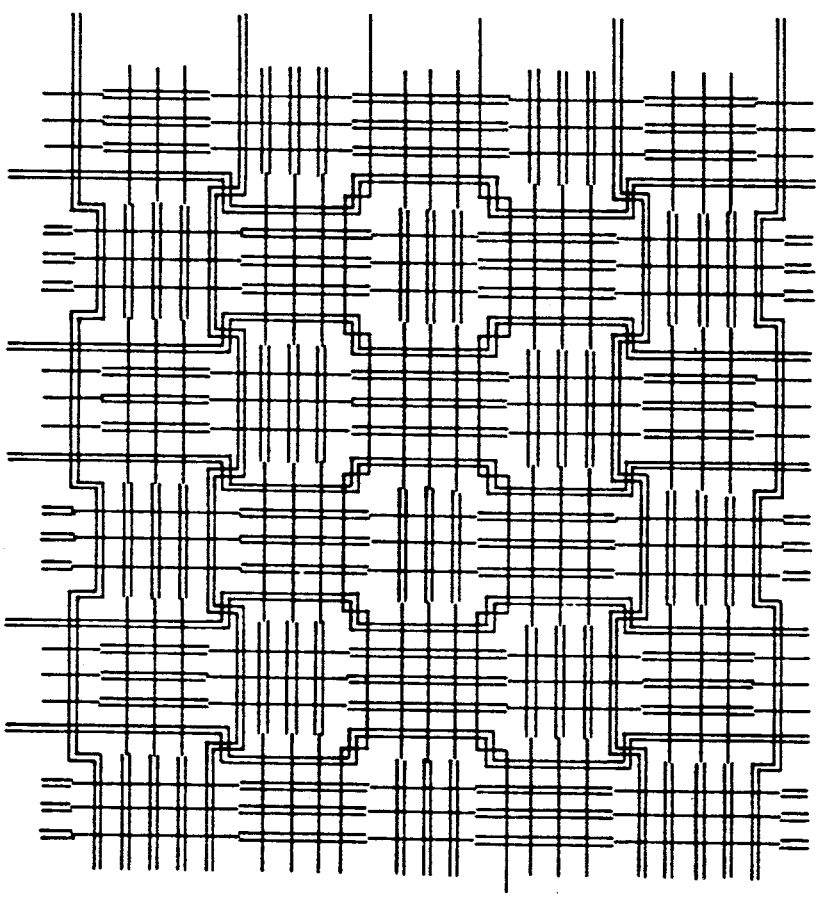
FIG. 15 is a pattern diagram illustrating another modification of the pattern shown in FIG. 2D.

Although, in the disclosed and described embodiment, the first wiring patterns LA serving as the power supply line $V_{DD}$ of $V_{SS}$ are arranged only along the longitudinal direction, the form of the arrangement of the power supply line is not restricted thereto. Namely, it is possible to easily modify the form of the arrangement of the power supply lines by suitably changing the fixed wiring patterns (LA,LB) in accordance with the conditions of the LSI to be constituted. For example, as shown in FIG. 14, respective wirings of the first wiring pattern LA and second wiring pattern LB serving as the power supply lines may be arranged in alternating succession in both the longitudinal direction and the transverse direction, respectively. Also, as shown in FIG. 15, each of the first wiring pattern LA and second wiring pattern LB may be arranged in a succession of alternating pairs along the longitudinal direction and only the second wiring pattern LB may be arranged along the transverse direction. Also, in some cases, it is also possible to utilize a portion of the first wiring pattern LA or second wiring pattern LB as the power supply line without taking the trouble to provide the wiring pattern for private use of the power supply line.

Also, although three terminals of the transistor, i.e., the gate, source and drain, are fixedly connected via the first contact holes NA to the first wirings LA in the above-described embodiment (see FIG. 2C), the form of the connection is not restricted thereto, as is obvious from the gist of the present invention. For example, each terminal of the transistor may be fixedly connected via the first contact holes NA and second contact holes NB to the second wirings LB.

Although the present invention has been disclosed and described by way of one embodiment, it is apparent to those skilled in the art that other embodiments and modifications of the present invention are possible without departing from the spirit or essential features thereof.

I claim:

1. A method of forming a semiconductor integrated circuit using a master slice approach comprising the steps of:

forming a plurality of transistor regions arranged as an array of a number of units on a semiconductor chip, each transistor region comprising gate, source and drain regions;

forming a first insulation layer over all said transistor regions;

forming, on said first insulation layer, a first wiring pattern of a plurality of spaced, first wiring units, each of plural first wirings of a common, length and extending in parallel and spaced relationship, the plurality of first wiring pattern units respectively corresponding to the plurality of transistor regions and being spaced so that the respective first wirings thereof are discontinuous and so that the plural first wirings of each said first wiring pattern unit are positioned in correspondence with respective gate, source and drain regions of the respective transistor region;

forming, in said first insulation layer, a first contact hole pattern of plural contact holes arranged at common, predetermined positions in correspondence to each of said plurality of first wiring pattern units for connecting the gate, source and drain regions of each transistor region to the corresponding first wirings of the respective first wiring pattern unit, for each of said plurality of respectively corresponding first wiring pattern units and transistor regions;

forming a second insulation layer over said first wiring pattern and said first contact hole pattern;

forming, on said second insulation layer, a second wiring pattern of a plurality of spaced, second wiring pattern units, each of plural second wirings of a common, predetermined length and extending in parallel and spaced relationship, said plurality of second wiring pattern units being positioned relatively to said plurality of first wiring pattern units so as to constitute therewith a mesh-like arrangement, and with said second wirings intersecting but not contacting said first wirings at positions corresponding to said transistor regions; and forming, in said second insulation layer, a second contact hole pattern of plural second contact holes arranged at positions defined by a pattern mask programmable in accordance with requirements of a given semiconductor integrated circuit, for selectively defining connections between and thereby selectively connecting said second wirings to said first wirings.

2. A method as recited in claim 1, wherein said semiconductor chip includes field oxide regions in addition to said transistor regions, and wherein said steps of forming said first and second wiring patterns include forming respective, further said first and second spaced wiring pattern units on said field oxide regions.

3. A method as recited in claim 2, wherein each of said first and second wiring pattern units comprises three parallel, spaced wirings.

4. A method as recited in claim 3, wherein said step of forming said first wiring pattern further comprises forming first, further wirings in each of said first wiring pattern units and extending continuously in a first direction on said semiconductor chip, said first further wirings defining power supply lines.

5. A method as recited in claim 3, wherein said step of forming said second wiring patterns further comprises forming second and third, further wirings in each of said second wiring pattern units and extending continuously along said semiconductor chip respectively in said first direction and in a second direction perpendicular to said first direction, said second and third, further wirings comprising further power supply lines.

6. A method as recited in claim 4, wherein said step of forming said first wiring pattern further includes forming fourth, further wirings in each of said first wiring pattern units and extending continuously along said semiconductor chip in said second direction, said fourth, further wirings comprising further power supply lines.

7. A method of forming a semiconductor integrated circuit using a master slice approach comprising the steps of:

forming a plurality of transistor regions arranged as an array of a number of units on a semiconductor chip, each transistor region comprising gate and source/drain regions;

forming a first insulation layer over all said transistor regions;

forming, on said first insulation layer, a first wiring pattern of a plurality of spaced, first wiring units, each of plural first wirings of a common, length and extending in parallel and spaced relationship, the plurality of first wiring pattern units respectively corresponding to the plurality of transistor regions and being spaced so that the respective first wirings thereof are discontinuous and so that the plural first wirings of each said first wiring pattern unit are positioned in correspondence with respective gate, source and drain regions of the respective transistor region;

forming, in said first insulation layer, a first contact hole pattern of plural contact holes arranged at common, predetermined positions in correspondence to each of said plurality of first wiring pattern units;

forming a second insulation layer over said first wiring pattern and said first contact hole pattern;

forming, on said second insulation layer, a second wiring pattern of a plurality of spaced, second wiring pattern units, each of plural second wirings of a common, predetermined length and extending in parallel and spaced relationship, said plurality of second wiring pattern units being positioned relatively to said plurality of first wiring pattern units so as to constitute therewith a mesh-like arrangement, and with said second wirings intersecting but not contacting said first wirings at positions corresponding to said transistor regions; and forming, in said second insulation layer, a second contact hole pattern of plural second contact holes arranged at positions defined by a pattern mask programmable in accordance with requirements of a given semiconductor integrated circuit, for selectively defining connections between and thereby selectively connecting said second wirings to said first wirings and, through said first wirings and said first contact holes, to said gate and source/drain regions of said transistor regions.

* * * * *

UNITED STATES PATENT AND TRADEMARK OFFICE
CERTIFICATE OF CORRECTION

PATENT NO. : 5,081,059

DATED : January 14, 1992

INVENTOR(S) : Ryoichi OHE

It is certified that error appears in the above-identified patent and that said Letters Patent is hereby corrected as shown below:

Col. 1, line 21, after "pattern" insert --and--.

Col. 3, line 46, after "single" insert --solid--.

Col. 4, line 26, delete "second pattern of";
line 27, before "LB" insert --pattern--;
line 28, change "wiring patterns" to --pattern of second wirings--;
line 45, change "pattern" to --portion--.

Signed and Sealed this

Twelfth Day of October, 1993

Attest:

BRUCE LEHMAN

Attesting Officer

Commissioner of Patents and Trademarks